(12) United States Patent
Dobbertin et al.

(10) Patent No.: US 9,297,504 B2
(45) Date of Patent: Mar. 29, 2016

(54) LUMINAIRE FOR GENERAL LIGHTING

(71) Applicant: OSRAM Opto Semiconductors GmbH, Regensburg (DE)

(72) Inventors: Thomas Dobbertin, Regensburg (DE); Steven Rossbach, Adorf (DE); Erwin Lang, Regensburg (DE)

(73) Assignee: OSRAM OLED GmbH, Regensberg (DE)

( * ) Notice: Subject to any disclaimer, the term of this patent is extended or adjusted under 35 U.S.C. 154(b) by 0 days.

(21) Appl. No.: 14/371,957

(22) PCT Filed: Dec. 7, 2012

(86) PCT No.: PCT/EP2012/074793
§ 371 (c)(1),
(2) Date: Jul. 11, 2014

(87) PCT Pub. No.: WO2013/104471
PCT Pub. Date: Jul. 18, 2013

(65) Prior Publication Data
US 2014/0362567 A1    Dec. 11, 2014

(30) Foreign Application Priority Data
Jan. 11, 2012  (DE) .......................... 10 2012 200 302

(51) Int. Cl.
*F21V 9/00*   (2015.01)
*F21K 99/00*  (2010.01)
(Continued)

(52) U.S. Cl.
CPC . *F21K 9/56* (2013.01); *F21S 8/061* (2013.01); *H01L 51/5036* (2013.01); *H01L 51/5234* (2013.01); *H01L 51/5265* (2013.01); *F21Y 2101/02* (2013.01); *F21Y 2105/008* (2013.01); *H01L 2251/5323* (2013.01); *H01L 2251/5361* (2013.01)

(58) Field of Classification Search
CPC ... F21K 9/56; H01L 51/5265; H01L 51/5036; H01L 51/5234; H01L 2251/5361; H01L 2251/5323; F21S 8/061; F21Y 2101/02; F21Y 2105/008
USPC .................................. 313/498–512; 362/231
See application file for complete search history.

(56) References Cited

U.S. PATENT DOCUMENTS 8,231,259 B2   7/2012   Keller et al.
8,339,034 B2   12/2012  Diekmann et al.
(Continued)

FOREIGN PATENT DOCUMENTS

DE   102006046196 A1   4/2008
DE   102008014317 A1   9/2009
(Continued)

*Primary Examiner* — Anne Hines
*Assistant Examiner* — Jose M Diaz
(74) *Attorney, Agent, or Firm* — Slater & Matsil, L.L.P.

(57) ABSTRACT

A luminaire for general lighting includes an illuminant having a first light emission surface and a second light emission surface. The illuminant includes an organic, light-generating region. The first light emission surface and the second light emission surface are arranged at two mutually opposite main surfaces of the illuminant. A first light emerges at the first light emission surface during the operation of the illuminant, and a second light emerges at the second light emission surface during the operation of the illuminant. The first light and the second light differ from one another with regard to color and/or color temperature. The first light and the second light leave the luminaire in mutually different emission directions.

16 Claims, 6 Drawing Sheets

(51) Int. Cl.
*F21S 8/06* (2006.01)
*H01L 51/50* (2006.01)
*H01L 51/52* (2006.01)
*F21Y 105/00* (2006.01)
*F21Y 101/02* (2006.01)

(56) References Cited

U.S. PATENT DOCUMENTS

2001/0002164 A1\* 5/2001 Ludwing et al. ............... 362/31
2008/0196843 A1\* 8/2008 Nien ...................... E06B 9/323
                                                        160/178.1 R
2009/0267502 A1   10/2009 Diekmann et al.
2010/0246158 A1    9/2010 Van Gorkom et al.
2012/0091923 A1    4/2012 Kastner-Jung et al.
2012/0313512 A1\* 12/2012 Yamada et al. ............... 313/504

FOREIGN PATENT DOCUMENTS

| WO | 2010066245 A1 | 6/2010 |
| WO | 2010142763 A1 | 12/2010 |
| WO | WO 2011102389 A1 \* | 8/2011 |

\* cited by examiner

LUMINAIRE FOR GENERAL LIGHTING

This patent application is a national phase filing under section 371 of PCT/EP2012/074793, filed Dec. 7, 2012, which claims the priority of German patent application 10 2012 200 302.9, filed Jan. 11, 2012, each of which is incorporated herein by reference in its entirety.

TECHNICAL FIELD

Embodiments of the invention relate to a luminaire for general lighting.

SUMMARY OF THE INVENTION

Embodiments specify a luminaire with which different types of light can be realized in a particularly space-saving manner.

A luminaire for general lighting is specified. The luminaire for general lighting is suitable for lighting an interior, for example. In this case, the luminaire can be provided, for example, for mounting at a ceiling, for example, in the manner of a pendant luminaire, or for mounting at a wall.

In accordance with at least one embodiment of the luminaire, the luminaire is suitable for general lighting. That is to say that the luminaire comprises at least one fixing apparatus which enables the luminaire to be fixed in a room, for example, at a ceiling or at a wall. During operation, the luminaire emits visible light suitable for illuminating the room or/and for illuminating objects in the room.

In accordance with at least one embodiment of the luminaire, the luminaire comprises an illuminant comprising a first light emission surface and a second light emission surface. The light emission surfaces of the illuminant are those surfaces from which the illuminant emits light generated during operation. In this case, the illuminant can be the sole illuminant of the luminaire. Furthermore, it is possible for the luminaire to comprise one or a plurality of illuminants, in particular of the same type.

The light emitted by the illuminant through the first light emission surface and the second light emission surface is that light which the luminaire for general lighting emits during operation.

In accordance with at least one embodiment of the illuminant, the illuminant comprises an organic light-generating region. In particular, the illuminant can then be an organic light-emitting diode or light-emitting electromechanical cells (LEC). An illuminant having an organic, light-generating region is suitable, in particular, for emitting light with a sufficient brightness for general lighting over a large light emission surface. By way of example, the first light emission surface and the second light emission surface of the illuminant each have an area of at least 10 cm$^2$, preferably of at least 25 cm$^2$.

In accordance with at least one embodiment of the luminaire, the first light emission surface and the second light emission surface are arranged at two mutually opposite main surfaces of the illuminant. By way of example, the illuminant is embodied as a disk. The light emission surfaces are then arranged at the top surface and the bottom surface of the disk. In this case, it is possible for the light emission surfaces respectively to form the top surface and the bottom surface. On account of the fact that the first light emission surface and the second light emission surface are arranged at two mutually opposite main surfaces of the illuminant, the illuminant emits light in mutually opposite directions from the two light emission surfaces. By way of example, main emission directions of the light emitted by the first light emission surface and by the second light emission surface during operation can be directed antiparallel to one another.

The two light emission surfaces of the illuminant can be, in particular, the sole light emission surfaces of the illuminant. That is to say that the illuminant then comprises no further light emission surfaces besides the first light emission surface and the second light emission surface. The two light emission surfaces can be connected to one another in particular by surfaces, for example, side surfaces of the illuminant, at which no light emerges.

In accordance with at least one embodiment of the luminaire, a first light emerges at the first light emission surface during the operation of the illuminant and a second light emerges at the second light emission surface during operation. In this case, the first light and the second light differ from one another with regard to color and/or color temperature. That is to say that the illuminant emits different light from its two light emission surfaces. In this case, the difference in the light is such that it can be perceived by the human observer. The first light and the second light are generated in the organic, light-generating region of the illuminant during the operation of the illuminant.

In accordance with at least one embodiment of the luminaire, the first light and the second light leave the luminaire in mutually different emission directions. If the luminaire is, for example, a pendant luminaire mounted at a ceiling, then the first light can be emitted principally in the direction of the ceiling and the second light is emitted principally away from the ceiling, for example, in the direction of a floor.

In accordance with at least one embodiment of the luminaire for general lighting, the luminaire comprises an illuminant comprising a first light emission surface and a second light emission surface. The illuminant comprises an organic, light-generating region, the first light emission surface and the second light emission surface are arranged at two mutually opposite main surfaces of the illuminant, a first light emerges at the first light emission surface during the operation of the illuminant, a second light emerges at the second light emission surface during the operation of the illuminant, the first light and the second light differ from one another with regard to color and/or color temperature, and the first light and the second light leave the luminaire in mutually different emission directions.

The luminaire described here generates two different types of light by means of the same illuminant. That is to say that, in particular, two different illuminants are not used to generate the first light and the second light, rather both types of light are generated by means of the same illuminant. In this way, it is possible for the illuminant, and thus also the luminaire, to be embodied in a particularly space-saving manner, in particular in a particularly thin manner. Furthermore, it is possible, by means of the luminaire, to generate lighting with two different types of light. In this way, when there is a person situated in a room illuminated by the luminaire, chronobiological effects can be initiated which, for example, can have a positive influence on the performance capability of the person.

In accordance with at least one embodiment of the luminaire, the luminaire is provided for mounting on a body, at a distance from the body, wherein the first light is emitted at least for the most part in the direction of the body and impinges thereon and the second light is emitted at least for the most part in the direction away from the body. In this case, "at least for the most part" means that preferably at least 50%, particularly preferably at least 75%, of the light emitted, for example, in the direction of the body impinges on the body. From there the light can then be reflected, for example, diffusely, away from the body.

In accordance with at least one embodiment of the luminaire, the luminaire is provided in particular for mounting, that is to say for mechanical fixing, at the body. The mounting at the body is effected, in particular, in such a way that the luminaire and thus the first light emission surface of the illuminant are arranged at a predefineable distance from the body. For this purpose, the luminaire can comprise a corresponding fixing apparatus provided for mounting the luminaire at a predefineable distance from the body. In particular, the luminaire can be fixed to the body by means of the fixing apparatus in such a way that the light emission surfaces of the luminaire cannot touch the body, rather a minimum distance of, for example, at least 2 cm is maintained between the first light emission surface and the body. This ensures that first light which passes from the first light emission surface to the body can be reflected there, and that portion of the first light which is subsequently reflected in a manner directed away from the body is not completely shaded by the luminaire.

The fixing apparatus can comprise, for example, a rope or a rope system or a rod. In this case, it is possible for the distance between luminaire and body to be adjustable by the user of the luminaire during the mounting thereof by corresponding shortening of the rope or the rod, that is to say the fixing apparatus.

In accordance with at least one embodiment of the luminaire, the first light is provided for indirect lighting and the second light is provided for direct lighting. That is to say that, by means of the fixing apparatus, for example, the luminaire is mounted in such a way that the first light cannot impinge directly in the room to be illuminated or on the region to be illuminated, rather a reflection of the first light, for example, at the body, is necessary before the first light can impinge in the room or the region to be illuminated. The body can then be, for example, a ceiling or a wall at which the luminaire is fixed by means of the fixing apparatus.

In accordance with at least one embodiment of the luminaire, the first light comprises a light color from the spectral range of blue light or the first light is blue light. In this case, it is also possible, in particular, for the first light to be bluish-white light.

In accordance with at least one embodiment of the luminaire, the first light is cold-white light. That is to say that the first light has a color temperature of at least 4000 K. In particular, the first light can have a color temperature of between 4000 K and 7500 K, preferably between 4300 K and 7500 K.

In accordance with at least one embodiment of the luminaire, the second light is warm-white light. The second light has a color temperature of at most 4000 K. In particular, the second light can have a color temperature of between 2000 K and 4000 K, preferably between 2000 K and 3700 K.

It has been found that in particular with the use of blue, bluish or cold-white light for indirect lighting and the simultaneous use of warm-white light for direct lighting, a chronobiological effect on a human being can be initiated which has a positive influence on the performance capability of the human being in particular at the workplace. In this case, the impression generated by the bluish or cold-white first light, which impression is often perceived as uninviting, appears to be compensated for by the direct lighting with warm-white light, without reducing or cancelling the positive influence of the cold-white light on the alertness and attention of the person illuminated indirectly with this light.

In accordance with at least one embodiment of the luminaire, the illuminant is a radiation-transmissive organic light-emitting diode. That is to say that the illuminant can be embodied as a transparent or clearly transparent organic light-emitting diode. It is likewise possible for the radiation-transmissive organic light-emitting diode to be a translucent organic light-emitting diode comprising a diffusing layer at at least one of the two light emission surfaces and/or comprising, near the light-generating region, for example, a diffusing layer for improving the internal coupling-out of light. For the functionality of the luminaire described, the organic light-emitting diode need not necessarily be configured in transparent fashion, but rather can also be milkily cloudy. The functionality of the emission in both emission directions can be maintained, as can the targeted setting of the different color temperatures upon emission into the two hemispheres.

Such a radiation-transmissive illuminant makes it possible, in a particularly simple manner, to generate first and second light having different color temperatures and/or different colors in a single illuminant. The illuminant is then an organic light-emitting diode which emits on both sides, for example. The first light and the second light can be generated by different technical measures in the interior of the illuminant such that different light colors and/or color temperatures can be generated. The technical measures can be, for example, cavity effects as a result of the distance between the light-generating region and a partly specularly reflective reflection layer, the order and constitution of the organic and inorganic layers and/or the thickness and the degree of doping of the different organic and inorganic layers in the illuminant.

In accordance with at least one embodiment of the luminaire, the distance between the first light emission surface and the second light emission surface of the illuminant is at most 1.0 cm. Such a thin illuminant can be realized, for example, by means of a radiation-transmissive organic light-emitting diode which emits on both sides. The illuminant is distinguished by its compact design, which enables a particularly space-saving luminaire. In this case, the luminaire can in particular substantially consist of the illuminant and the fixing apparatus for fixing the luminaire.

BRIEF DESCRIPTION OF THE DRAWINGS

A luminaire described here is explained in greater detail below on the basis of exemplary embodiments and the associated figures.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

DETAILED DESCRIPTION OF ILLUSTRATIVE EMBODIMENTS

Figure 1:
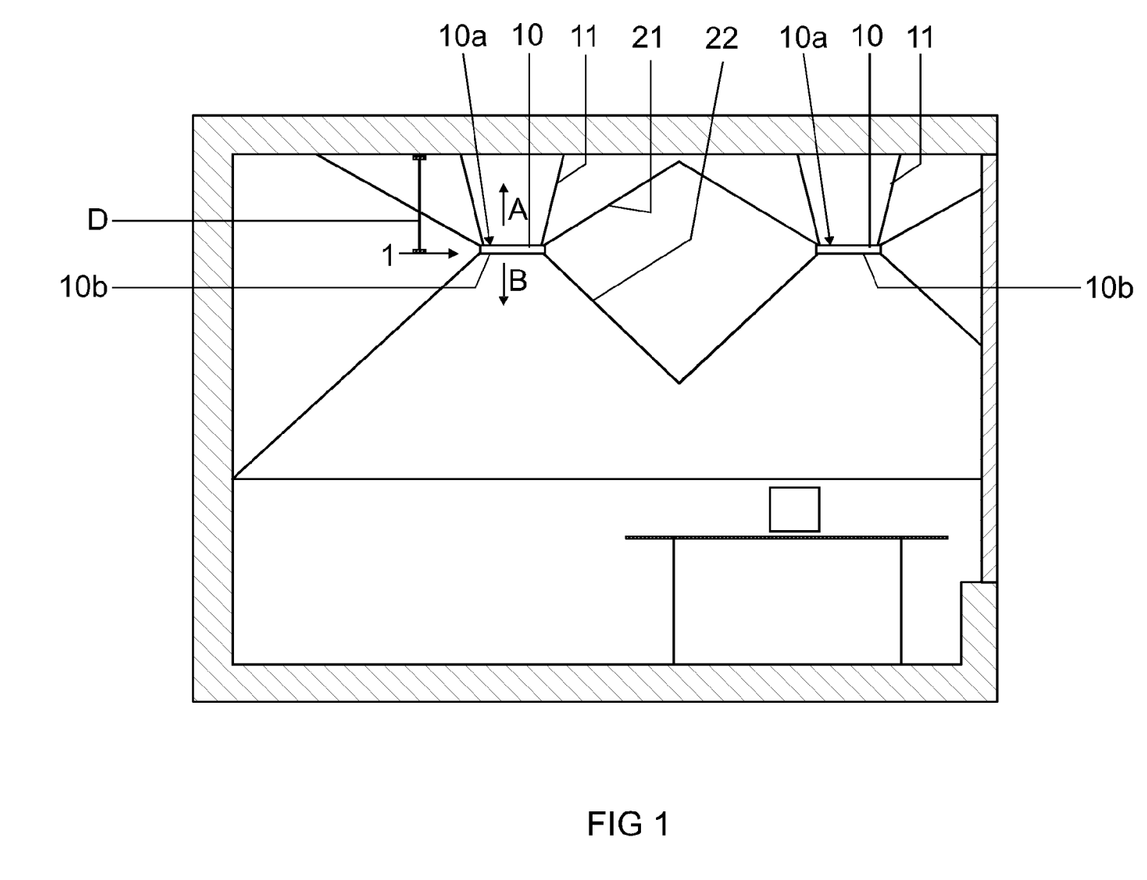
FIG. 1 shows a schematic illustration for elucidating an exemplary embodiment of a luminaire 1 described here.

FIG. 1 schematically shows a sectional illustration through a room illuminated by two luminaires 1 for general lighting as described here. In the exemplary embodiment in FIG. 1, the luminaires 1 are in each case pendant luminaires.

The luminaires 1 comprise an illuminant 10 and a fixing apparatus 11. In the present case, the fixing apparatus 11 is a rope system with which the illuminant 10 of the luminaire is arranged at a distance from a body 3, a ceiling in the present case. The fixing apparatus 11 ensures, in particular, that the luminaire 1 can be fixed to the body 3 in such a way that a predefineable distance between the luminaire 1 and thus the illuminant 10 and the body 3 is set.

In this case, a first light emission surface 10a is directed toward the body 3, and a second light emission surface 10b is directed away from the body. Correspondingly, a first light 21 is emitted toward the body 3 during the operation of the luminaire 1. The first light 21 illuminates a specific area of the body 3, of the ceiling in the present case, depending on the distance D between illuminant 10 and body 3. The size of the illuminated area can be increased by the distance D being increased and is thus adjustable. At least part of the first light 21 is reflected from the illuminated area of the body 3, of the ceiling in the present case, in the direction away from the body 3 and impinges as light for indirect lighting on an area to be illuminated. In this case, the first light 21 is emitted in the direction A toward the body 3.

The second light 22 emitted by the second light emission surface 10b during operation is radiated in a manner directed in the direction B away from the body 3 directly into the room. This light is light provided for direct lighting.

In the present case, the first light 21 is blue, bluish or cold-white light, whereas the second light 22 is warm-white light.

Overall, the luminaire shown in FIG. 1 makes it possible for the directly illuminated, for example, white, ceiling of a room to appear bluish, cold-white and thus to reproduce the impression of a sky in broad daylight. The second, warm-white light 22 provided for direct lighting gives the impression of direct insolation.

Figure 2A:
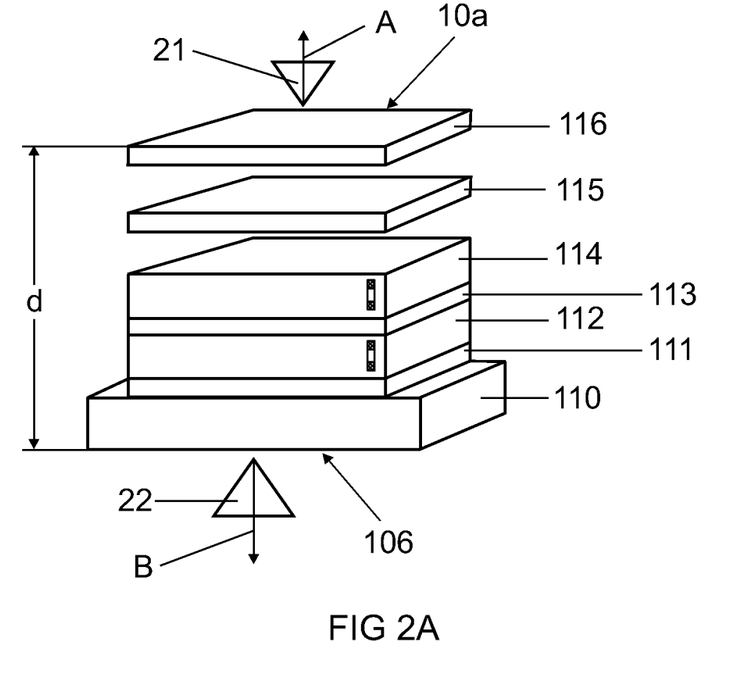
With reference to FIGS. 2A, 2B, 3A, 3B and 4, illuminants which can be used in exemplary embodiments of a luminaire described here are explained in greater detail.

In conjunction with the schematic sectional illustration in FIG. 2A, a description is given of an illuminant 10 which can be used in a luminaire 1 described here. The illuminant 10 is a radiation-transmissive organic light-emitting diode which emits on both sides. The illuminant 10 comprises, for example, a radiation-transmissive carrier body 110, which can be a substrate, to which inorganic and organic layers of the illuminant 10 are applied. By way of example, the carrier body 110 can be formed with a transparent and clear glass. That side of the carrier body 110 which faces away from the further layers 111 to 116 forms the second light emission surface 10b of the illuminant. During the operation of the illuminant 10, the second light 22 is emitted by this second light emission surface 10b in the direction B.

A first electrode 111 is arranged at that side of the carrier body 110 which faces away from the second light emission surface 10b. The first electrode 111 can be, for example, an anode of the illuminant 10. In the present case, the first electrode 111 is formed with ITO and is therefore radiation-transmissive. In this case, the first electrode 111 can be embodied in clearly transparent fashion.

At that side of the first electrode 111 which faces away from the carrier body 110 there follow the first organic layer 112, the organic, light-generating region 113 and the second organic layer 114. In this case, the first organic layer 112 and the second organic layer 114 can comprise hole-conducting, electron-conducting, electron-blocking and/or hole-blocking layers. The generation of the first light and of the second light is effected in the active region 113.

The second electrode 115, which can be embodied as at least partly reflective, is arranged at that side of the second organic layer 114 which faces away from the active region 113. The second electrode 115 can be formed with aluminum and/or silver or consist of one of these metals, for example. Furthermore, it is possible for the second electrode 115 to be embodied as transparent or semitransparent. The second electrode 115 can then be formed with or consist of, for example, transparent conductive oxides (TCO, such as, e.g., ITO, AZO, ZnO) and/or (semi)transparent thin metal films (TMF) composed of Ag, Mg, Sm, Ca, Cu, Au and/or an alloy/combination composed of the metals mentioned and/or composed of TCO-TMF-TCO layers.

An antireflection coating 116 is arranged at that side of the second electrode 115 which faces away from the second organic layer 114, which second electrode can act as a cathode. That outer surface of the antireflection coating 116 which faces away from the second electrode 115 serves as a first light exit surface 10a of the illuminant 10, from which the first light 21 provided for indirect lighting emerges in the direction A during operation.

Overall, in this way it is possible to realize an illuminant 10 in which the distance d between the first light exit surface 10a and the second light exit surface 10b is at most 1 cm. In the case of the illuminant 10, the emission by the first light exit surface 10a can be set, for example, by the thickness of the second electrode 115. This is illustrated in the graphical plot in FIG. 2B, where, as a function of the wavelength of the light generated in the light-generating region 113 during operation, the transmissivity T in percent is plotted for various thicknesses of the second electrode 115. As a function of the wavelength $\lambda$ of the generated light, the transmissivity is all the greater, the thinner the second electrode 115 is made.

Figure 2B:
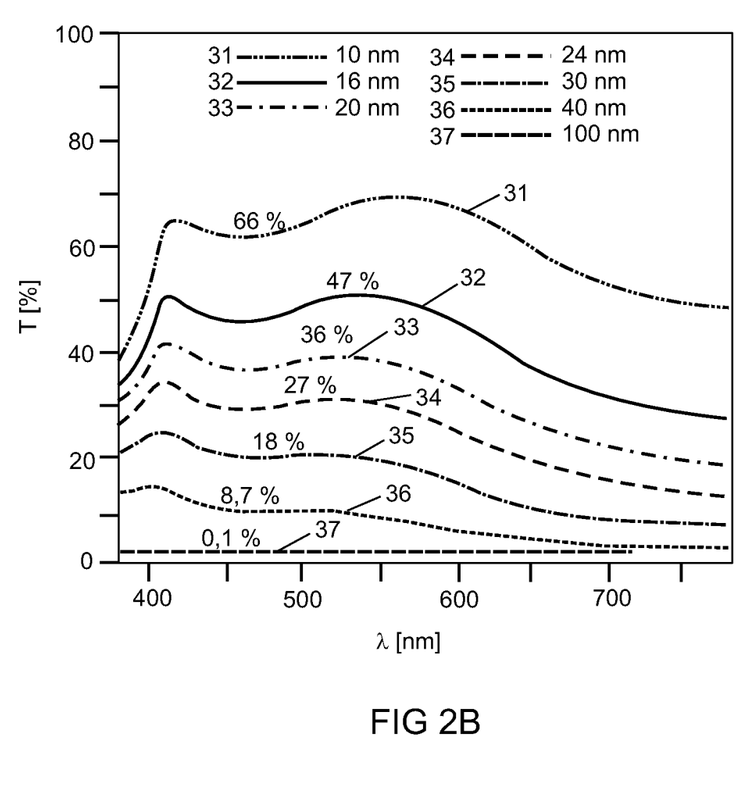

By means of the cavity effect, the emission ratio in both light directions 1, 2 and the color temperature of the light emitted in the two light directions can then be set in a targeted manner by the setting of the distance between the light-generating region 113 and the second electrode 115. This is also described in a different context in the U.S. Patent Publication No. 2009/0267502, the disclosure content of which, in particular with regard to the setting of the emission characteristic using the cavity effect in an organic light-emitting diode, is hereby expressly incorporated by reference.

Figure 3A:
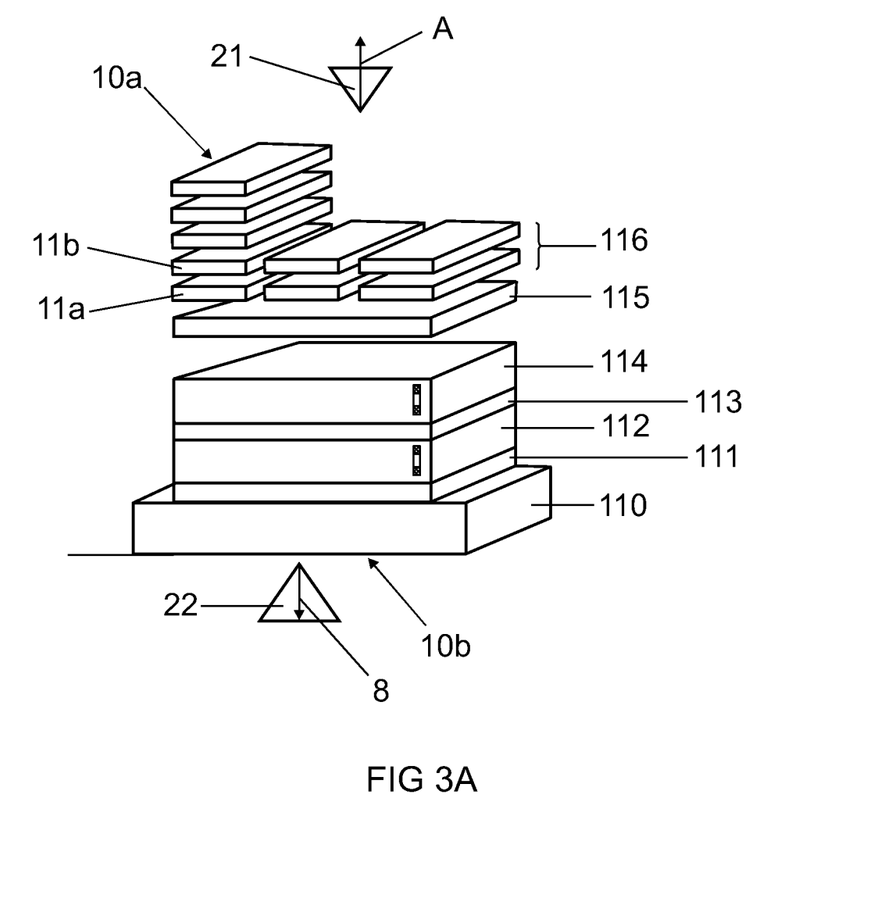

In conjunction with FIG. 3A, a description is given of an illuminant 10 such as can be used in one exemplary embodiment of a luminaire 1 described here, wherein the transmissivity T at the first light exit surface 10a is set by adaptation of the antireflection coating 116. In this respect, in a departure from the exemplary embodiment in FIG. 2A, FIG. 3A shows that the antireflection coating is embodied as a layer sequence of high refractive index layers 116a and low refractive index layers 116b. The graphical plot in FIG. 3B illustrates the transmissivity T as a function of the wavelength $\lambda$ of the light generated in the light-generating region 113 during operation.

Figure 3B:
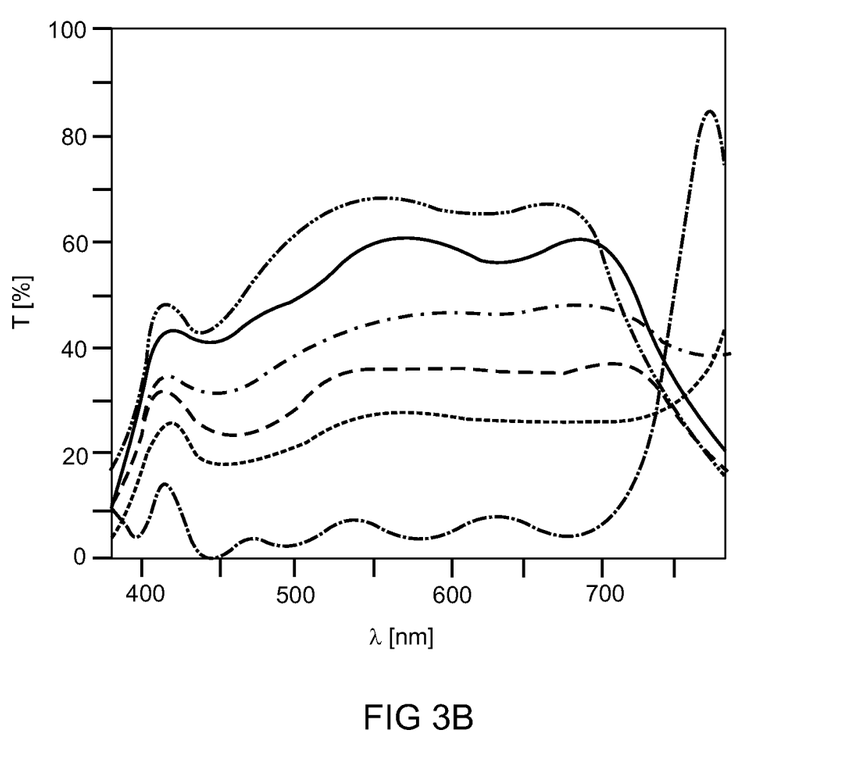

The lines in FIG. 3B relate to an antireflection coating 116 in accordance with the configuration shown in FIG. 3A. In this case, different lines relate to different embodiments of the antireflection coating 116, that is to say, to different numbers and thicknesses of the low and high refractive index layers 116a, 116b and of the electrode 15. Different transparencies 115 arise for different configurations.

Overall, both of FIGS. 2B and 3B clarify that the reflectivity and the transparency of the electrode system can be set both by means of the electrode itself (e.g., suitable layer thickness, e.g., of Ag) and by means of an adaptation of the antireflection coating 116. A targeted variation of the color temperature of the emitted light can thus be achieved both by adaptation of the thickness and type of the electrode material and by the antireflection coating 116. As is shown in FIG. 3B, for example, the reflectivity in the green-red spectral range can be varied greatly in a targeted manner and the reflectivity in the blue spectral range can be varied to a lesser extent in a targeted manner.

Essentially only the total reflectivity of the electrode system independently of the cause, that is to say in particular the layer thickness of the electrode 115 or the choice of suitable antireflection layers, influences the emission characteristic, that is to say, for example, the emission ratio and/or the color temperature of the two emission directions.

Figure 4:
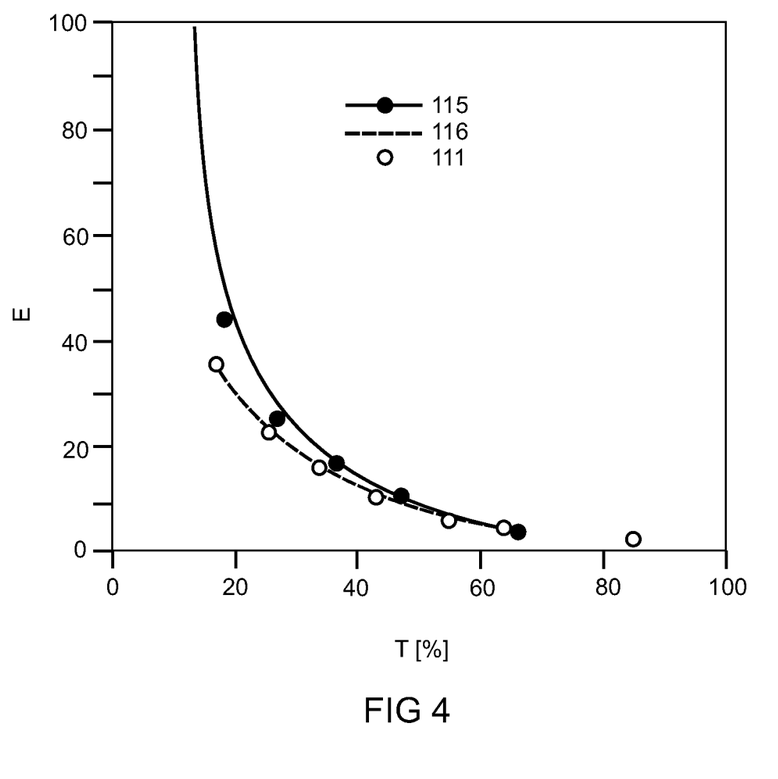

FIG. 4 graphically illustrates the emission ratio between an emission by the second light emission surface 10b in relation to the first light emission surface 10a for various thicknesses of the second electrode 115 and different configurations of the antireflection coating 116. It is evident, for example, that the thicker the second electrode 115, the less light passes through the second light exit surface 10b.

The different curves in FIGS. 2B and 3B are assigned an average transparency in the visible spectral range (e.g., between 450 nm and 650 nm): e.g., T ~20%, ~40%, . . . , ~65%. This is carried out for the various configurations. With these configurations, the emission ratio is subsequently determined in each case and plotted against the corresponding averaged transparency, see FIG. 4. Thus, a very similar profile for the emission ratio arises as a function of the total transparency for both configurations (variation of layer thickness of cathode and variation of antireflection layers).

Overall, this means that both the emission ratio and the color temperature of the emitted light can be influenced with the aid of different influencing variables. The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A luminaire for general lighting comprising:
   an illuminant comprising a first light emission surface and a second light emission surface, wherein:
   the illuminant comprises an organic, light-generating region;
   the first light emission surface and the second light emission surface are arranged at two mutually opposite main surfaces of the illuminant;
   the illuminant emits different light from its two light emission surfaces;
   a first light emerges at the first light emission surface during operation of the illuminant;
   a second light emerges at the second light emission surface during the operation of the illuminant;
   the first light and the second light differ from one another with regard to color and/or color temperature; and
   the first light and the second light leave the luminaire in mutually different emission directions.

2. The luminaire according to claim 1, wherein the luminaire is provided for mounting to a body, wherein the first light is emitted at least for the most part in the direction of the body and impinges thereon and the second light is emitted at least for the most part in the direction away from the body.

3. The luminaire according to claim 1, further comprising a fixing apparatus configured to mount the luminaire to a body.

4. The luminaire according to claim 3, wherein the first light is emitted at least for the most part in the direction of the body and impinges thereon and the second light is emitted at least for the most part in the direction away from the body.

5. The luminaire according to claim 2, further comprising fixing means for mounting the luminaire in such a way that the illuminant is situated at a predefineable distance from the body.

6. The luminaire according to claim 1, wherein the first light is provided for indirect lighting and the second light is provided for direct lighting.

7. The luminaire according to claim 6, wherein the first light is blue light and the second light is white light.

8. The luminaire according to claim 1, wherein the first light comprises a light color from a spectral range of blue light or is blue light.

9. The luminaire according to claim 1, wherein the first light is cold-white light.

10. The luminaire according to claim 1, wherein the second light is warm-white light.

11. The luminaire according to claim 1, wherein the illuminant is a radiation-transmissive organic light-emitting diode.

12. The luminaire according to claim 11, wherein the illuminant is a translucent organic light-emitting diode.

13. The luminaire according to claim 1, wherein a distance between the first light emission surface and the second light emission surface is at most 1.0 cm.

14. The luminaire according to claim 1, wherein the luminaire is mounted at a ceiling, wherein the first light is emitted in a direction of the ceiling and the second light is emitted in a direction of a floor which is situated on a side of the luminaire which faces away from the ceiling.

15. The luminaire according to claim 1, wherein the first light and the second light emitted by the luminaire through the first light emission surface and the second light emission surface is a light which the luminaire for general lighting emits during the operation.

16. A luminaire for general lighting comprising:
   an illuminant comprising a first light emission surface and a second light emission surface, wherein:
   the illuminant comprises an organic, light-generating region;
   the first light emission surface and the second light emission surface are arranged at two mutually opposite main surfaces of the illuminant;
   the illuminant emits different light from its two light emission surfaces;
   a first light emerges at the first light emission surface during operation of the illuminant, wherein the first light is provided for indirect lighting;
   a second light emerges at the second light emission surface during the operation of the illuminant, wherein the second light is provided for direct lighting;
   the first light and the second light differ from one another with regard to color and/or color temperature;
   the first light and the second light leave the luminaire in mutually different emission directions; and
   the first light is cold-white light and the second light is warm-white light.

* * * * *